United States Patent
Abe et al.

(10) Patent No.: US 10,081,491 B2
(45) Date of Patent: Sep. 25, 2018

(54) ARTICLE STORAGE FACILITY

(71) Applicant: Daifuku Co., Ltd., Osaka-shi (JP)

(72) Inventors: Takeshi Abe, Shiga (JP); Toshihito Ueda, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 300 days.

(21) Appl. No.: 14/955,365

(22) Filed: Dec. 1, 2015

(65) Prior Publication Data

US 2016/0152412 A1    Jun. 2, 2016

(30) Foreign Application Priority Data

Dec. 2, 2014 (JP) ................................ 2014-243977

(51) Int. Cl.
  *B65G 1/04* (2006.01)
  *H01L 21/67* (2006.01)
  *H01L 21/677* (2006.01)

(52) U.S. Cl.
  CPC ........ *B65G 1/0407* (2013.01); *H01L 21/6773* (2013.01); *H01L 21/67288* (2013.01); *H01L 21/67769* (2013.01); *B65G 2207/40* (2013.01)

(58) Field of Classification Search
  CPC .............. B65G 1/0407; B65G 2207/40; H01L 21/6773; H01L 21/67769; H01L 21/67772; H01L 21/67288
  See application file for complete search history.

(56) References Cited

U.S. PATENT DOCUMENTS 9,266,629 B2    2/2016  Takahara et al.
2007/0065259 A1*  3/2007  Talley .................. B65G 1/0407
                                         414/279
(Continued)

FOREIGN PATENT DOCUMENTS

JP    2007326686 A    12/2007
JP    2009007124      * 1/2009    ............... B65G 1/04
(Continued)

*Primary Examiner* — Saul Rodriguez
*Assistant Examiner* — Ashley K Romano
(74) *Attorney, Agent, or Firm* — The Webb Law Firm

(57) ABSTRACT

In an article storage facility, a door pivotable about a door pivot axis extending in a second direction is provided in an opening which is formed in a path-dividing wall portion that divides a traveling path and through which a transport movable body can pass. The door is configured such that its position is switchable between a closed position in which the door extends along the path-dividing wall portion and blocks the opening and an open position in which the door is located on an internal space side and opens the opening so that the transport movable body can pass through the opening. The article storage facility includes a blocking member that is switchable to a blocking state in which the blocking member blocks a portion through which the internal space and an external space communicate with each other in a state in which the position of the door is switched to an intermediate position between the open position and the closed position or to the open position and the transport movable body is stopped at a target position, the target position being a position of the transport movable body at which the opening is within the extent of the transport movable body in a first direction.

7 Claims, 12 Drawing Sheets

(56) References Cited

U.S. PATENT DOCUMENTS

2008/0014058 A1* 1/2008 Hongkham ....... H01L 21/67173
  414/222.01
2013/0270063 A1* 10/2013 Yoshinaga ............. A62C 3/002
  198/358
2016/0332815 A1* 11/2016 Ueda ...................... B65G 1/137

FOREIGN PATENT DOCUMENTS

JP        2010016144      *  1/2010
JP        2013142009  A     7/2013

* cited by examiner

ARTICLE STORAGE FACILITY

CROSS-REFERENCE TO RELATED APPLICATION

This application claims priority to Japanese Patent Application No. 2014-243977 filed Dec. 2, 2014, the disclosure of which is hereby incorporated in its entirety by reference.

FIELD OF THE INVENTION

The present invention relates to an article storage facility including an article storage rack including a plurality of storage sections arranged in a first direction along a horizontal direction and a second direction along a vertical direction, the storage sections each being capable of storing a container in which a semiconductor substrate is accommodated, a transport movable body that is movable along a traveling path in the first direction, the travelling path being provided extending in the first direction in front of the article storage rack, and a wall-shaped member that is provided laterally around an internal space in which the article storage rack and the transport movable body are arranged and that demarcates the internal space from an external space in plan view.

BACKGROUND

JP 2007-326686A, for example, discloses an example of article storage facilities such as that described above. In an article storage facility disclosed in JP 2007-326686A, a wall-shaped member that demarcates an internal space from an external space in plan view has an opening for entry and exit of a worker and a door whose position is switchable between an open position and a closed position. Here, the open position is a position in which the door opens the opening so that the worker can pass through the opening, and the closed position is a position in which the door closes the opening. According to the article storage facility disclosed in JP 2007-326686A, the worker enters the internal space through the opening and performs maintenance work on a transport movable body inside the internal space.

Another example of the article storage facilities is an article storage facility, such as that disclosed in JP 2013-142009A, having a configuration that prevents contamination of semiconductor substrates in a container stored in the internal space. The article storage facility disclosed in JP 2013-142009A is configured to supply cleaned air to the internal space such that the cleaned air flows from the ceiling side to the floor side of the internal space in order to maintain a clean environment with reduced dust in the internal space. Moreover, according to the article storage facility disclosed in JP 2013-142009A, an inactive gas such as nitrogen is supplied to the inside of the container in order to suppress contamination of the semiconductor substrates in the container.

SUMMARY OF THE INVENTION

According to the article storage facility disclosed in JP 2013-142009A, in order to replace a gas inside the container with the inactive gas and maintain a state in which the inside of the container is filled with the inactive gas, the inactive gas is continuously or intermittently supplied to the container. The inactive gas is thus discharged from the container to the internal space, causing the concentration of the inactive gas in the internal space to become higher than that of the external space. That is to say, the oxygen concentration in the internal space tends to be relatively low, and thus there is a risk that the internal space may become an environment in which it is difficult for the worker to work.

To address this issue, with respect to the article storage facility of JP 2013-142009A as well, it is conceivable to form an opening in a wall-shaped member, provide a door that opens and closes the opening, and perform maintenance work on a transport movable body by retrieving the transport movable body to the external space through the opening, as in the case of the article storage facility disclosed in JP 2007-326686A. Moreover, even if no inactive gas is supplied to an article storage facility unlike the article storage facility disclosed in JP 2013-142009A, it is conceivable to perform maintenance work on the transport movable body by retrieving the transport movable body to the external space from the viewpoint of workability.

In order to retrieve the transport movable body from the internal space to the external space, for example, a configuration is conceivable in which a traveling path is formed extending continuously from the internal space to the external space in a state in which the traveling path is divided by the wall-shaped member, an opening through which the transport movable body can pass is provided in a path-dividing wall portion that is a portion of the wall-shaped member that divides the traveling path, and the transport movable body is thus allowed to move from the internal space to the external space via the opening.

In order to suppress leakage of the inactive gas through the opening to the external space or in order to maintain an air flow (downward flow) from the ceiling side to the floor side in the internal space, it is required that the opening be opened when the transport movable body is passing therethrough and closed when the transport movable body is not passing therethrough.

In semiconductor manufacturing facilities and the like in which an article storage facility is installed, it is desired that even during maintenance, the influence of the article storage facility on the surrounding space be minimized. That is to say, the region of the external space that is occupied by the transport movable body needs to be minimized. However, in the case where the transport movable body is located in the external space with the door in the closed position during maintenance, a position that is as close to the door, which is in the closed position, as possible is the limit position of the transport movable body with respect to the first direction. This raises a problem in that the region of the external space that is occupied by the transport movable body during maintenance increases.

Therefore, an article storage facility is desired that can minimize the amount of the external space that is occupied by the transport movable body during maintenance.

In view of the above-described circumstances, a characteristic configuration of an article storage facility is that the article storage facility includes an article storage rack including a plurality of storage sections arranged in a first direction along a horizontal direction and a second direction along a vertical direction, the storage sections each being capable of storing a container in which a semiconductor substrate is accommodated, a transport movable body that is movable along a traveling path in the first direction, the travelling path being provided extending in the first direction in front of the article storage rack, and a wall-shaped member that is provided laterally around an internal space in which the article storage rack and the transport movable body are arranged and that demarcates the internal space from an external space in plan view, wherein the transport movable body includes a transfer device that is capable of transferring the container between the transfer device and each of the storage sections, wherein the traveling path is formed extending continuously from the internal space to the external space in a state in which the travelling path is divided by the wall-shaped member, an opening through which the transport movable body can pass is formed in a path-dividing wall portion that is a portion of the wall-shaped member that divides the traveling path, a door that is pivotable about a door pivot axis extending in the second direction is provided in the opening, the door is configured such that a position thereof is switchable between a closed position in which the door extends along the path-dividing wall portion and blocks the opening and an open position in which the door is located on the internal space side and opens the opening so that the transport movable body can pass through the opening, and a blocking member is provided that is switchable to a blocking state in which the blocking member blocks a portion through which the internal space and the external space communicate with each other in a state in which the position of the door is switched to an intermediate position between the open position and the closed position or to the open position and the transport movable body is stopped at a target position, the target position being a position of the transport movable body at which the opening is within an extent of the transport movable body in the first direction.

That is to say, the transport movable body can be retrieved to the external space by switching the door to the open position, stopping the transport movable body at the target position, then, switching the door to the intermediate position or the open position, and in this state, switching the blocking member to the blocking state.

Thus, the amount of the external space that is occupied by the transport movable body can be reduced when compared with, for example, a configuration in which the transport movable body is retrieved to the external space by switching the door to the closed position in a state in which the entire transport movable body is located on an outward side of the opening with respect to the first direction.

It should be noted that the blocking state as used herein includes not only a state in which the flow of a gas between the internal space and the external space is completely shut off, but also a state in which the flow of a small amount of gas between the internal space and the external space is allowed.

Therefore, it is possible to provide an article storage facility that can minimize the amount of the external space that is occupied by a transport movable body during maintenance.

DETAILED DESCRIPTION

The following is a description of embodiments of an article storage facility based on the drawings. Here, the embodiments in the case where the article storage facility is applied to a semiconductor container warehouse will be described.

Figure 1:
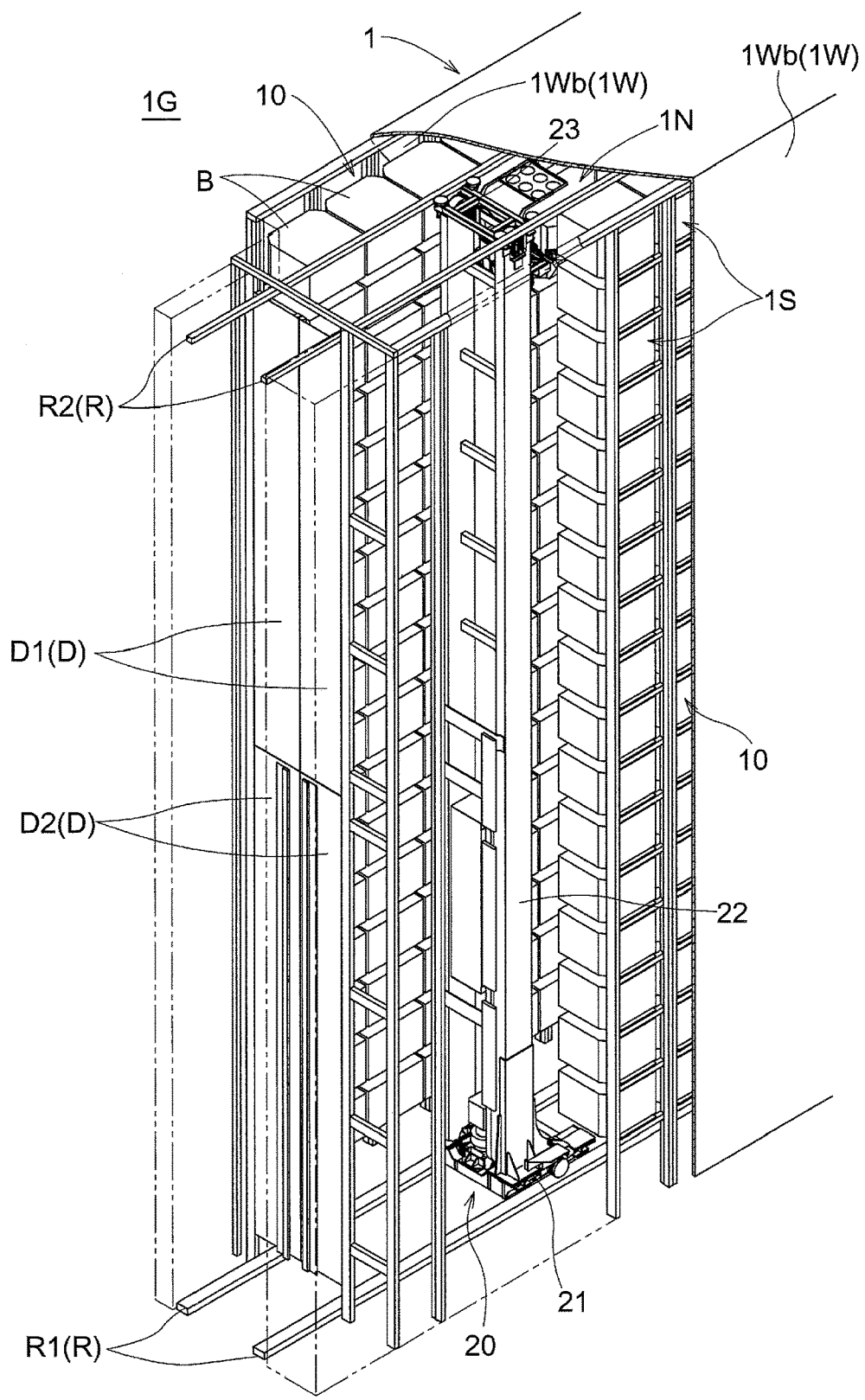
FIG. 1 is a partially cut-away perspective view that schematically shows a semiconductor container warehouse.
Figure 2:
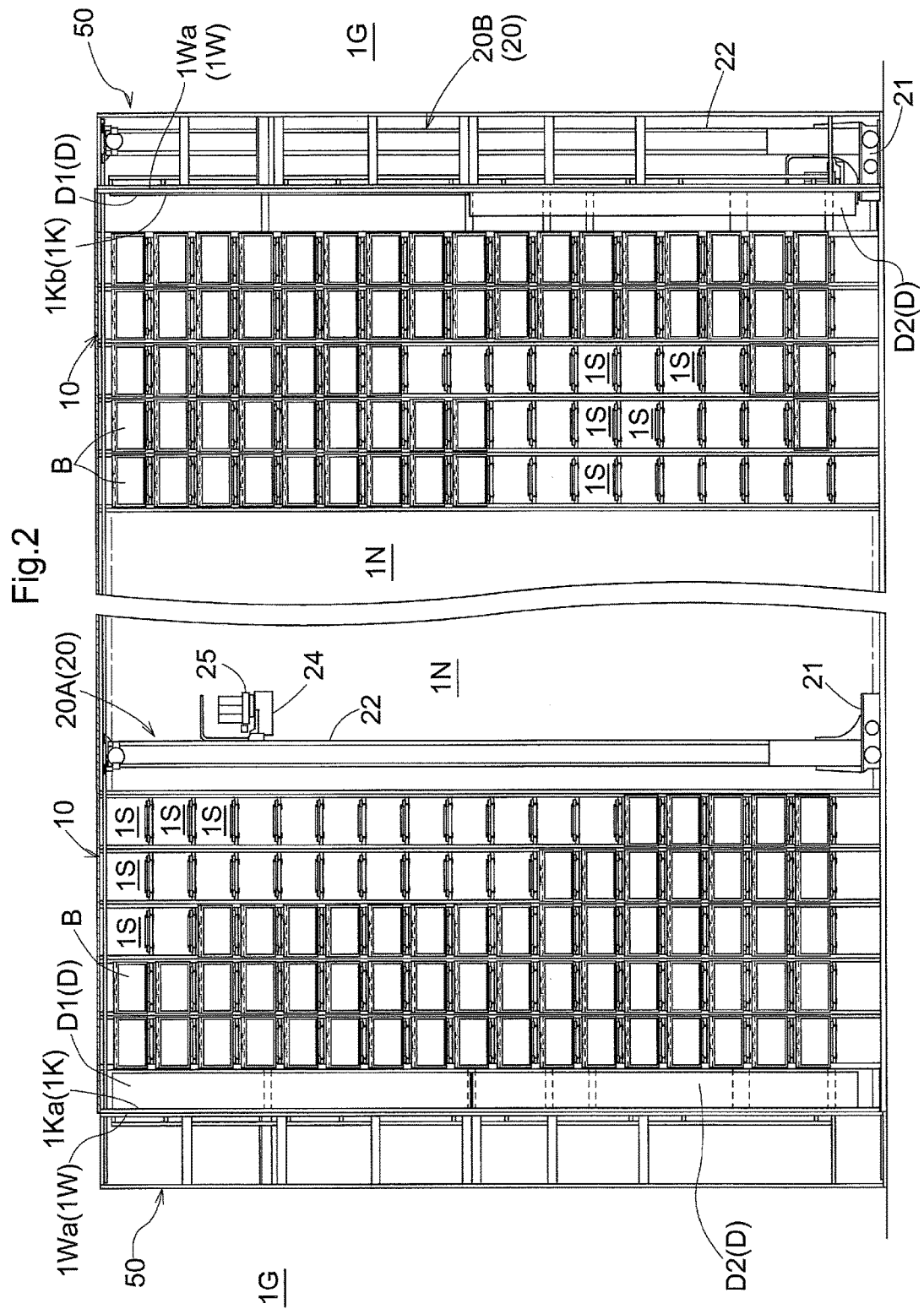
FIG. 2 is a vertical cross-sectional view showing a relevant portion of the semiconductor container warehouse.

As shown in FIGS. 1 and 2, a semiconductor container warehouse 1 includes an article storage rack 10 and a transport movable body 20. The article storage rack 10 includes a plurality of storage sections 15 arranged in left-right and vertical directions, each storage section 15 being capable of storing a container B, such as a FOUP (Front Opening Unified Pod), that accommodates semiconductor substrates. The transport movable body 20 is configured to be movable in the left-right direction on a traveling rail R that is provided extending in the left-right direction in front of the article storage rack 10. The transport movable body 20 includes a transfer device 25 capable of transferring a container B between the transfer device 25 and a storage section 15. In the present embodiment, the left-right direction corresponds to a "first direction along a horizontal direction", and the vertical direction corresponds to a "second direction along a vertical direction".

The article storage rack 10 includes a plurality of placement portions that are arranged in the vertical and left-right directions and on which the containers B may be placed and supported. In the present embodiment, each storage section 15 is formed between a single placement portion and another placement portion directly over that single placement portion and also between placement portions directly adjacent to the left and right, respectively, of that single placement portion with respect to the left-right direction. It should be noted that although not shown in the drawings, the placement portions are each provided with an inactive gas supply portion for supplying an inactive gas such as nitrogen into the container B.

With regard to the article storage rack 10, a pair of article storage racks 10 are opposed to each other with their access sides to/from which the containers B are loaded/unloaded facing each other, and spaced apart from each other in the loading/unloading direction of the containers B. The traveling rail R on which the transport movable body 20 travels is installed extending in the left-right direction between the pair of article storage racks 10. In the present embodiment, the extent of the traveling rail R in the left-right direction is set as a traveling path.

The pair of article storage racks 10 and the transport movable body 20 that are described above are arranged in an inner space, namely, an internal space 1N surrounded by a wall-shaped member 1W (a pair of path-dividing wall portions 1Wa that are opposed to each other and a pair of wall portions 1Wb that extend in the left-right direction and that are opposed to each other). The wall-shaped member 1W has a rectangular shape in plan view and demarcates the internal space 1N from an external space 1G in plan view.

That is to say, the wall-shaped member 1W is provided laterally around the internal space 1N, in which the article storage racks 10 and the transport movable body 20 are arranged, and demarcates the internal space 1N from the external space 1G in plan view.

It should be noted that although not shown in the drawings, an air flow generator that causes air to flow downward is provided in a ceiling portion of the semiconductor container warehouse 1 and configured such that an air flow (downward flow) directed from the ceiling side to the floor side is formed inside the internal space 1N.

As shown in FIGS. 1 and 2, the transport movable body 20 includes a traveling truck 21 that is capable of traveling on lower rails R1 constituting the traveling rail R, elevator masts 22 that are provided upright on the traveling truck 21, and an elevation body 24 that moves up and down guided by the elevator masts 22. The elevator masts 22 are provided upright on a portion of the traveling truck 21 that is nearer to one side of the traveling truck 21 than a central portion thereof with respect to the traveling direction. That is to say, the elevator masts 22 are provided upright on a portion of the traveling truck 21 that is nearer to a first side, which is one side of the traveling truck 21 with respect to the left-right direction, than the central portion of the traveling truck 21 with respect to the left-right direction. Also, upper rails R2 are provided above the lower rails R. Guide wheels that are provided on an upper frame 23 at upper ends of the elevator masts 22 are guided by the upper rails R2.

The elevation body 24 is provided in a state in which it extends to a side opposite to an end portion of the traveling truck 21 where the elevator masts 22 are present with respect to the traveling direction. That is to say, the elevation body 24 is provided so as to extend to the side opposite to the first side from the elevator masts 22.

Figure 12:
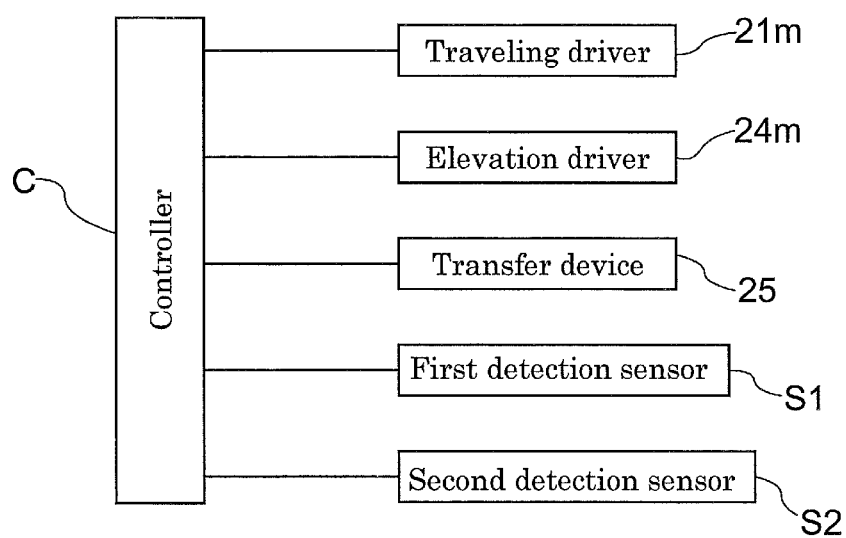
FIG. 12 is a control block diagram.

Moreover, as shown in FIG. 12, a controller C is provided that controls driving of a traveling driver 21m provided in the traveling truck 21, the operation of an elevation driver 24m that causes the elevation body 24 to move up and down, the transfer operation of the transfer device 25, and the like. That is to say, the controller C controls the transport operation of the transport movable body 20.

As shown in FIG. 2, an opening 1K through which the transport movable body 20 can pass is formed in each of the pair of path-dividing wall portions 1Wa that are located in proximity to the corresponding opposite ends of the traveling path (traveling rail R) with respect to the left-right direction (traveling direction of the transport movable body 20) in plan view. The traveling rail R is set to extend from the internal space 1N side to the external space 1G side through each opening 1K.

That is to say, the traveling path is formed extending continuously from the internal space 1N to the external space 1G in a state in which it is divided by the wall-shaped member 1W. In addition, the openings 1K through which the transport movable body 20 can pass are formed in the respective path-dividing wall portions 1Wa, which are portions of the wall-shaped member 1W that divide the traveling path.

Moreover, a first transport movable body 20A and a second transport movable body 20B that individually travel along the traveling path (on a single traveling path in the present example) are provided as the transport movable body 20. With respect to the traveling direction of the transport movable body 20, a traveling area that is covered by the first transport movable body 20A and a traveling area that is covered by the second transport movable body 20B are set so as not to overlap each other.

The first transport movable body 20A and the second transport movable body 20B are provided in such a position that, when located in the internal space 1N, an end portion of the traveling truck 21 that is in proximity to the elevator masts 22 with respect to the traveling direction is located in proximity to a door D on the side where the transport movable body is present. That is to say, each transport movable body serving as the transport movable body 20 is provided in an orientation in which the above-described first side faces the corresponding door D. Specifically, the first transport movable body 20A is provided in an orientation in which the first side thereof faces a first door, which will be described later, and the second transport movable body 20B is provided in an orientation in which the first side thereof faces a second door, which will be described later.

The following is a description of the doors D provided in the respective openings. The doors D are individually provided in the respective openings 1K that are formed in the pair of path-dividing wall portions 1Wa. The pair of path-dividing wall portions 1Wa are located in proximity to the corresponding opposite ends of the traveling path. That is to say, as shown in FIG. 2, a first opening 1Ka serving as the opening 1K is formed in the path-dividing wall portion 1Wa that constitutes an end portion of the wall-shaped member 1W on the first transport movable body 20A side. It should be noted that the end portion of the wall-shaped member 1W on the first transport movable body 20A side refers to a leading end portion of the wall-shaped member 1W with respect to a direction from the second transport movable body 20B toward the first transport movable body 20A along the left-right direction. A first door serving as the door is provided in the first opening 1Ka, and a first blocking member serving as a blocking member is provided corresponding to the first door. In the present embodiment, the first blocking member is provided in the first opening 1Ka in a state in which it is attached to the first door. Also, a second opening 1Kb serving as the opening 1K is formed in the path-dividing wall portion 1Wa that constitutes an end portion of the wall-shaped member 1W on the second transport movable body 20B side. It should be noted that the end portion of the wall-shaped member 1W on the second transport movable body 20B side refers to a leading end portion of the wall-shaped member 1W with respect to a direction from the first transport movable body 20A toward the second transport movable body 20B along the left-right direction. A second door serving as the door D is provided in the second opening 1Kb, and a second blocking member serving as the blocking member is provided corresponding to the second door. In the present embodiment, the second blocking member is provided in the second opening 1Kb in a state in which it is attached to the second door. In the present embodiment, a sub-door D3 provided on the first door corresponds to the first blocking member, and a sub-door D3 provided on the second door corresponds to the second blocking member.

It should be noted that since the doors D provided in the respective openings 1K of the pair of path-dividing wall portions 1Wa have the same configuration, the following description focuses on one of the openings 1K as an example.

Figure 3:
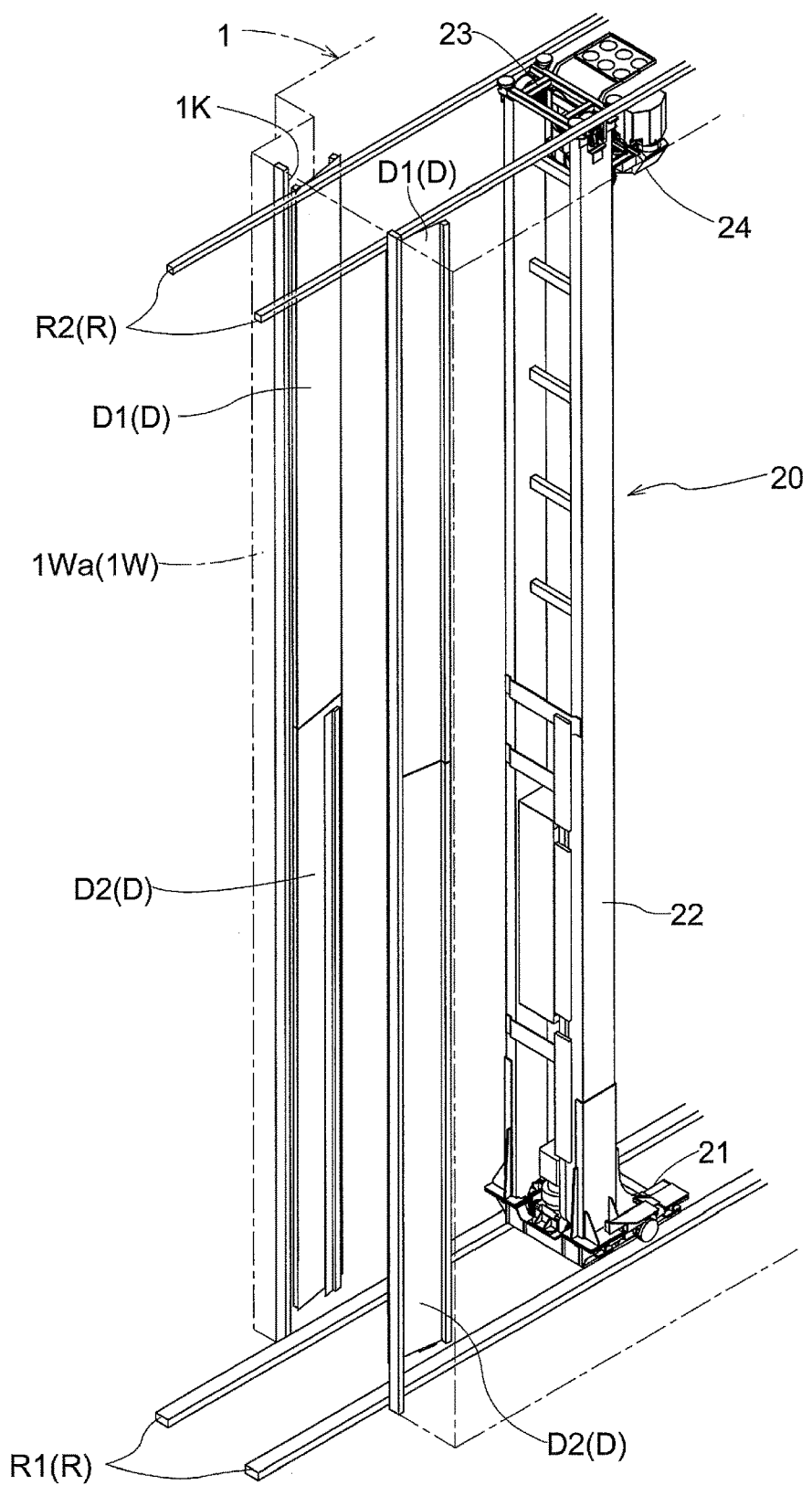
FIG. 3 is a perspective view showing a relevant portion of the semiconductor container warehouse in a state in which a door is in an open position.
Figure 4:
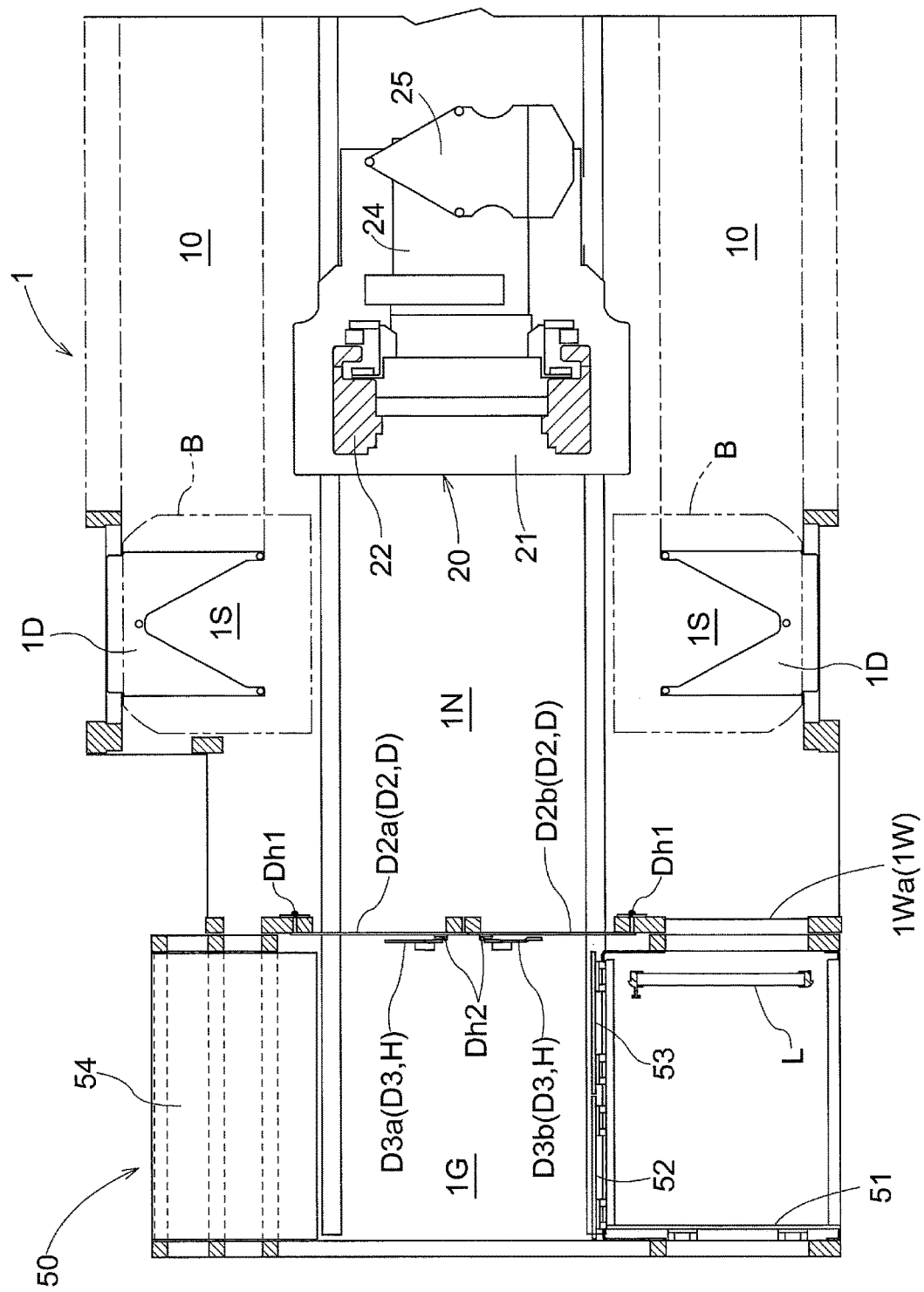
FIG. 4 is a plan view showing a relevant portion of the semiconductor container warehouse in a state in which the door is in a closed position.

As shown in FIGS. 1 to 3 and the like, an upper door D1 that is pivotable about a door pivot axis Dh1 (see FIGS. 4 to 7) extending in the vertical direction and that is located on an upper side with respect to the vertical direction and a lower door D2 that is pivotable about the door pivot axis Dh1 (door pivot shaft) and that is located on a lower side with respect to the vertical direction are provided in the opening 1K. In the present embodiment, the doors D each include the upper door D1 and the lower door D2.

The upper door D1 and the lower door D2 are each configured such that its position is switchable between a closed position (see FIGS. 1 and 4) in which the door extends along the path-dividing wall portion 1Wa and blocks the opening 1K and an open position (see FIGS. 3 and 5) in which the door is located on the internal space 1N side and opens the opening 1K so that the transport movable body 20 can pass through the opening 1K.

In the present embodiment, the upper door D1 and the lower door D2 correspond to split portions (upper and lower split portions). That is to say, in the present embodiment, each door D is split into a plurality of split portions in the vertical direction. In the present example, each door D is split into the two split portions, namely, the upper door D1 and the lower door D2. The upper door D1 and the lower door D2 are configured such that the positions of these doors are individually switchable between the open position and the closed position.

Moreover, as shown in FIGS. 6 to 10, the lower door D2 is provided with the sub-door D3. The sub-door D3 is configured such that in a state in which the position of the lower door D2 has been switched to an intermediate position between the open position and the closed position, and the transport movable body 20 is stopped at a stop position for retrieval (position of the first transport movable body 20A in FIG. 8), the sub-door D3 can be switched to a blocking state in which it blocks a portion through which the internal space 1N and the external space 1G communicate with each other (see FIG. 7). The stop position for retrieval refers to a position of the transport movable body 20 at which the opening 1K is located (opening 1K is contained) within the extent of the transport movable body 20 in the left-right direction. That it so say, the stop position for retrieval corresponds to a "target position". In the present embodiment, the sub-door D3 corresponds to a blocking member H.

Figure 6:
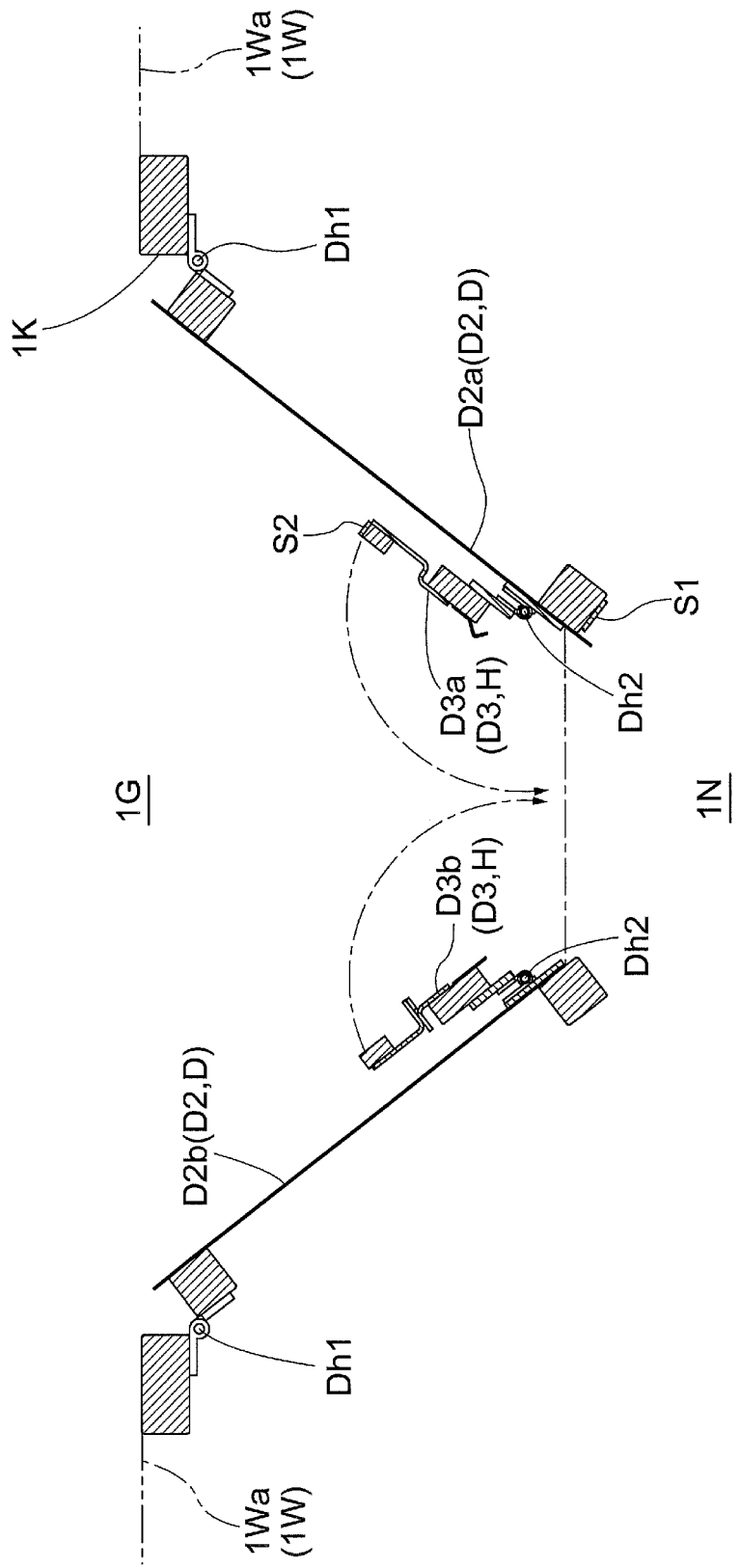
FIG. 6 is a plan view showing the semiconductor container warehouse in a state in which a lower door is in an intermediate position.
Figure 7:
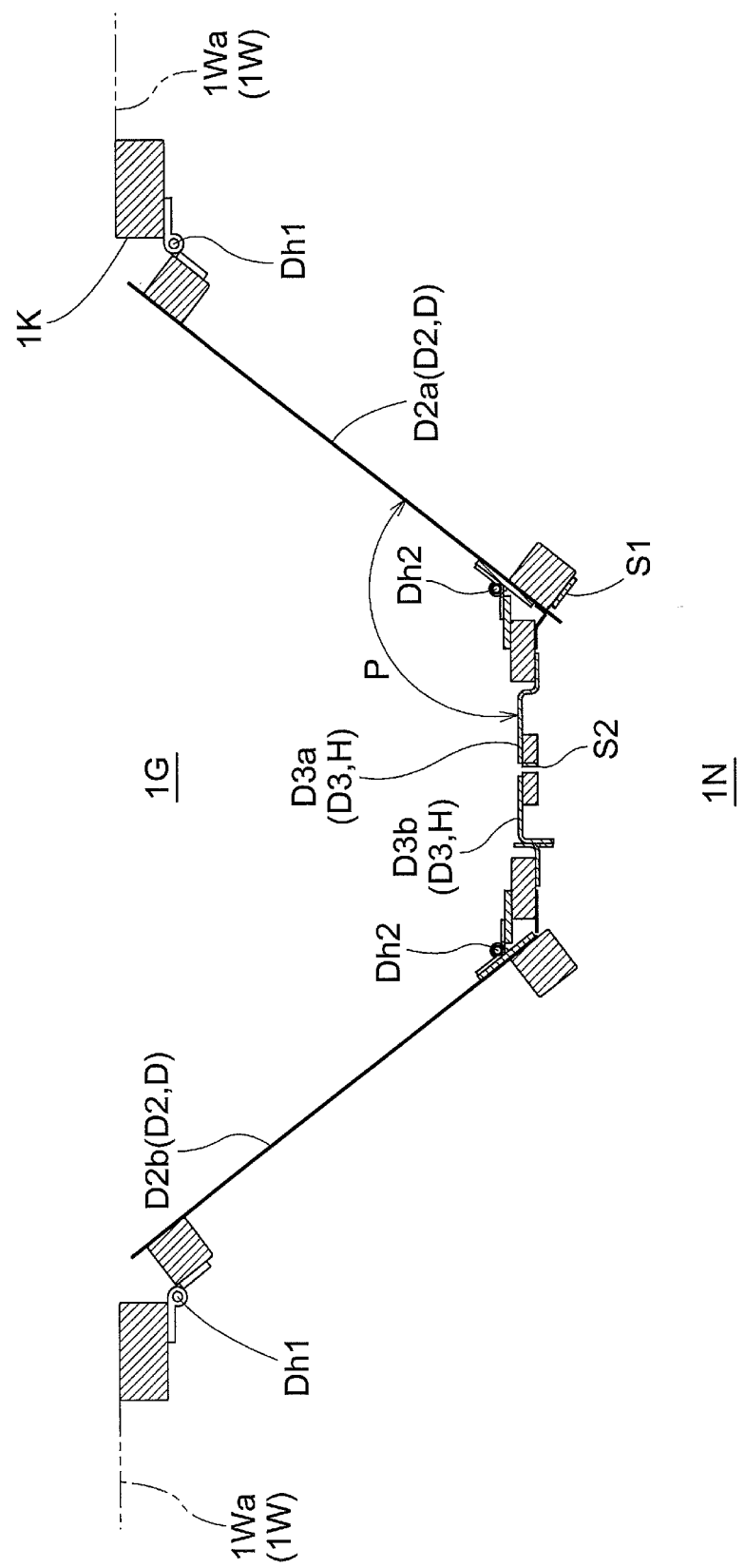
FIG. 7 is a plan view showing the semiconductor container warehouse in a state in which the lower door is in the intermediate position and a sub-door is in a blocking position.

As shown in FIGS. 6 and 7, the sub-door D3 is attached to the lower door D2 in such a manner as to be pivotable about a blocking member pivot axis Dh2 (blocking member pivot shaft). The blocking member pivot axis Dh2 is provided on an end portion of the lower door D2 on a side opposite to the door pivot axis Dh1 in plan view.

That is to say, the sub-door D3 is provided on at least one split portion (one split portion in the present example) of the plurality of split portions.

The sub-door D3 is configured such that its position is switchable between a storage position (see FIG. 6) in which the sub-door D3 extends along the lower door D2 in plan view and a blocking position (see FIG. 7). Here, the blocking position is a position in which the sub-door D3 has a larger pivot angle P than that in the storage position, where the pivot angle P is an angle that is formed by the lower door D2 and the sub-door D3 around the blocking member pivot axis Dh2 in plan view (see FIG. 7). In the present embodiment, as shown in FIG. 6, when the sub-door D3 is in the storage position, the pivot angle P is 0°.

Moreover, a configuration is adopted in which the sub-door D3 is switched to the blocking state by switching the position of the lower door D2 to the intermediate position and switching the position of the sub-door D3 to the blocking position.

It should be noted that when the sub-door D3 is switched to the blocking position after the upper door D1 has been switched to the closed position and the lower door D2 to the intermediate position, a trapezoidal gap surrounded by the upper door D1, the lower door D2, and the sub-door D3 in plan view is formed in a portion where the upper door D1 and the lower door D2 are adjacent to each other in the vertical direction. However, not a very large volume of gas leaks from the internal space 1N to the external space 1G through this gap. Thus, the blocking state as used herein also includes a state in which a gap such as that described above is formed.

As shown in FIGS. 6 and 7, the upper door D1 and the lower door D2 are provided with a first detection sensor S1 of a proximity detection type that detects whether the upper door D1 or the lower door D2 is in the closed position. Also, the sub-door D3 is provided with a second detection sensor S2 of the proximity detection type that detects whether the sub-door D3 is in the blocking state. As shown in FIG. 12, a configuration is adopted in which detection information from the first detection sensor S1 and the second detection sensor S2 is input to the controller C. In the present embodiment, the first detection sensor S1 and the second detection sensor S2 correspond to a door state detector that detects whether the door D is in the closed position and whether the sub-door D3 is in the blocking state.

In the present embodiment, the first door and the second door are provided as the doors D, and separate door state detectors corresponding to the respective doors D are provided. That is to say, the first door is provided with a first door state detector that detects whether the first door is in the closed position and whether the first blocking member is in the blocking state, and the second door is provided with a second door state detector that detects whether the second door is in the closed position and whether the second blocking member is in the blocking state.

The controller C is configured to allow the first transport movable body 20A to perform the transport operation on the condition that a first operation-permitted state is achieved, and to allow the second transport movable body 20B to perform the transport operation on the condition that a second operation-permitted state is achieved. Here, the first operation-permitted state refers to either a state in which the first door state detector detects that the first door is in the closed position or a state in which the first door state detector detects that the first blocking member is not in the blocking state. Also, the second operation-permitted state refers to either a state in which the second door state detector detects that the second door is in the closed position or a state in which the second door state detector detects that the second blocking member is not in the blocking state.

As described above, the controller C is configured to allow the transport movable body 20 to perform the transport operation on the condition that the operation-permitted state is achieved, the operation-permitted state being either the state in which the first detection sensor S1 detects that the door D is in the closed position or the state in which the second detection sensor S2 detects that the sub-door D3 is not in the blocking state.

Figure 10:
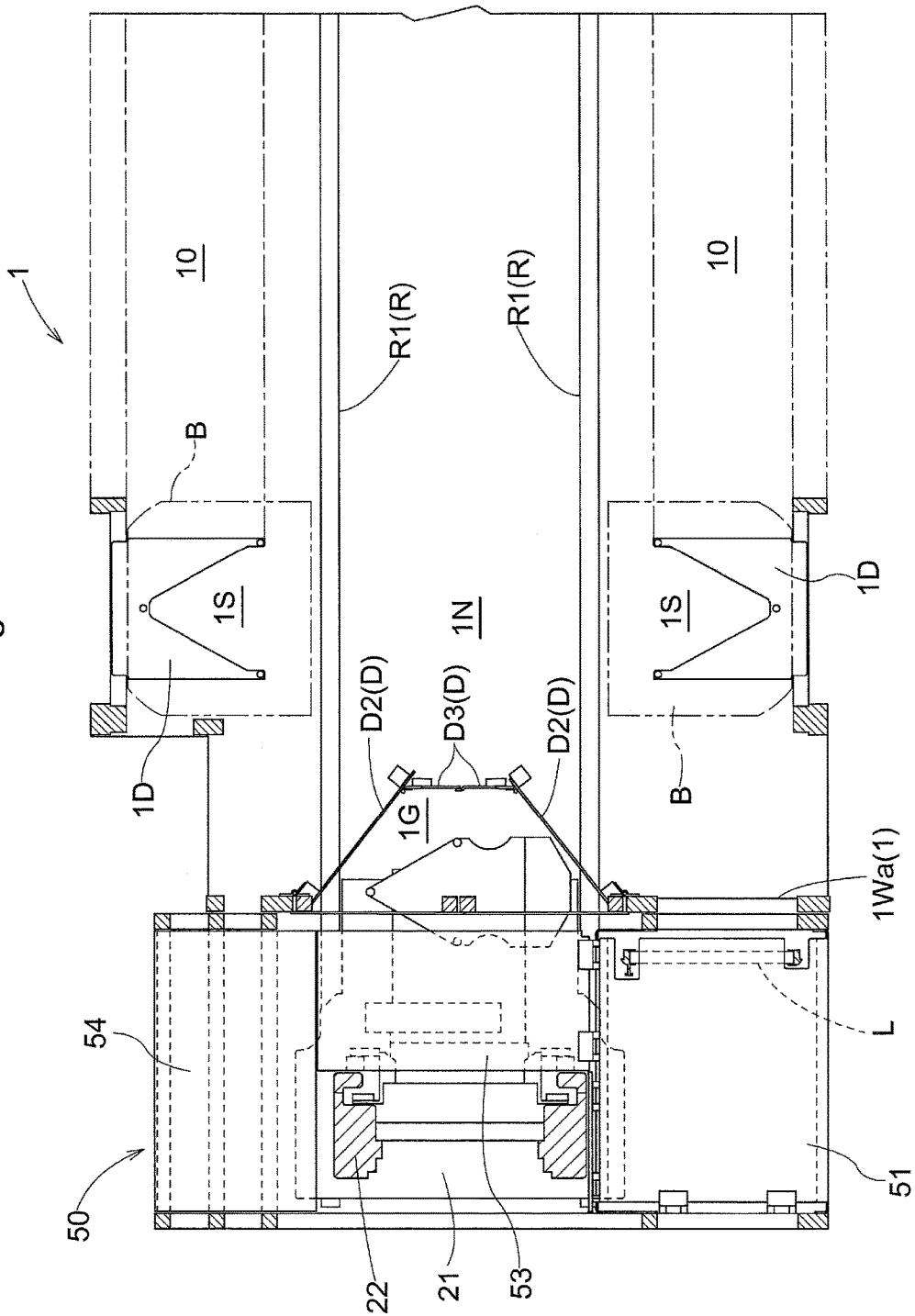
FIG. 10 is a plan view showing the semiconductor container warehouse in a state in which a scaffold for external maintenance is switched to a boarding position.
Figure 11:
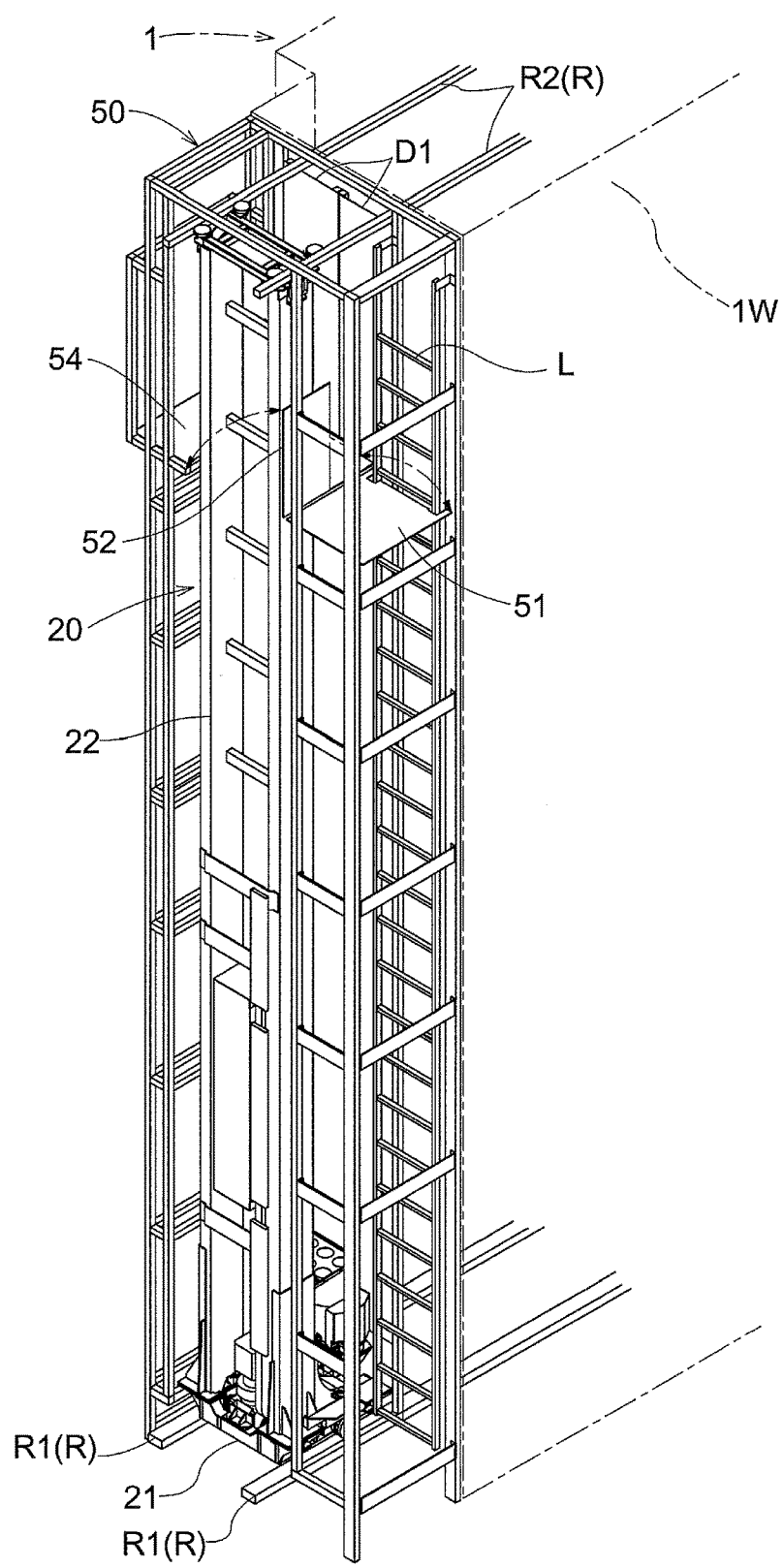
FIG. 11 is a perspective view showing how the scaffold for external maintenance is switched between a horizontal position and the boarding position.

Next, work scaffolding 50 for external work will be described based on FIGS. 10 and 11.

A support frame including struts and cross members that are assembled into a tower-like structure is provided on an external surface side of each path-dividing wall portion 1Wa, and a ladder L for allowing the worker to climb up and down inside the support frame is attached to and extends along the external surface of the path-dividing wall portion 1Wa. Also, a first footboard 51, a second footboard 52, a third footboard 53, and a fourth footboard 54 on which the worker stands to work in high places are provided at a height where the upper door D1 is present with respect to the vertical direction. The first footboard 51 is provided on the back side of the ladder L so as to be pivotable about a horizontal axis and is configured such that its position is switchable between a boarding position in which the first footboard 51 extends in the horizontal direction and a stored position in which the first footboard 51 extends in the vertical direction. The first footboard 51 is switched to the stored position by pivoting a pivoting end portion thereof upward when the worker climbs up and down the ladder L, and is switched to the boarding position by pivoting the pivoting end portion downward after the worker has climbed up the ladder L and passed the height at which the first footboard 51 is installed. Thus, the first footboard 51 can be used as a scaffold on which the worker stands to work.

The second footboard 52 and the third footboard 53 are provided adjacent to each other in the left-right direction, and are arranged in the order of the third footboard 53 and the second footboard 52 from the side that is nearer to the path-dividing wall portion 1Wa. The fourth footboard 54 is provided on the opposite side of the traveling rail R from the first footboard 51 in plan view. The fourth footboard 54 is not pivotable and is fixed to the support frame in a horizontally-extending position. In a state in which the transport movable body 20 is stopped at the stop position for retrieval, the elevator masts 22 are spaced apart from the upper door D1, and thus the third footboard 53 can be interposed between the upper door D1 and the elevator masts 22 (see FIG. 10). Therefore, when the third footboard 53 is switched to the boarding position, the worker can work using the first footboard 51, the third footboard 53, and the fourth footboard 54 around the elevator masts 22 as the scaffolds.

Next, a procedure for performing maintenance of the transport movable body 20 of the semiconductor container warehouse 1 according to the present embodiment will be described.

First, if maintenance is required due to a failure or the like of the transport movable body 20, the transport movable body 20 is switched to a manual operation mode that allows the worker to operate the transport movable body 20 by manual instruction.

Figure 5:
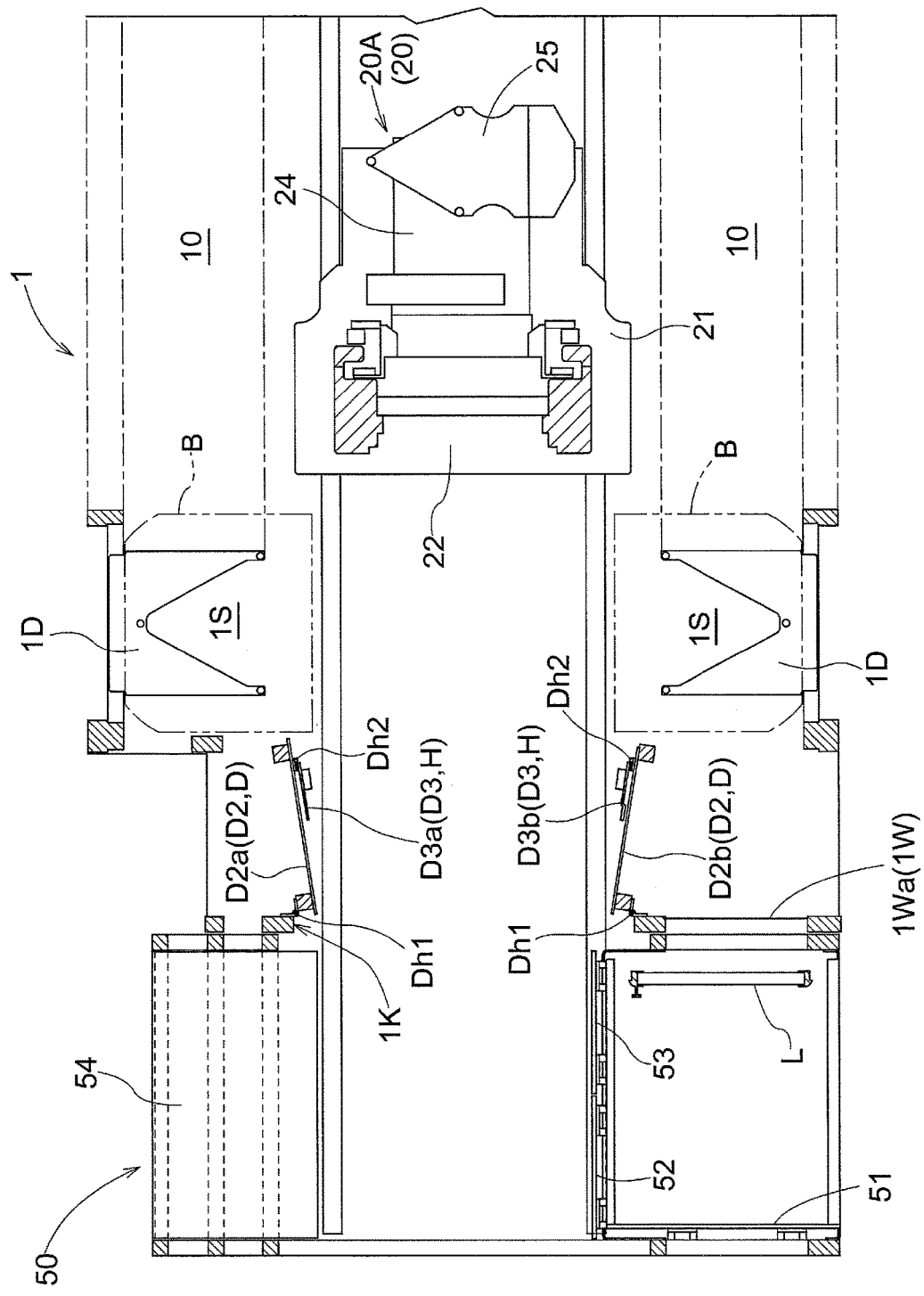
FIG. 5 is a plan view showing a relevant portion of the semiconductor container warehouse in a state in which the door is in the open position.

After that, as shown in FIG. 5, the worker switches the lower door D2 and the upper door D1 to the open positions and moves the transport movable body 20 to the stop position for retrieval at which the opening 1K is located within the extent of the transport movable body 20 in the left-right direction. In addition, the worker lowers the elevation body 24 so as to locate the elevation body 24 at a lower limit position of the up-down movement.

Figure 9:
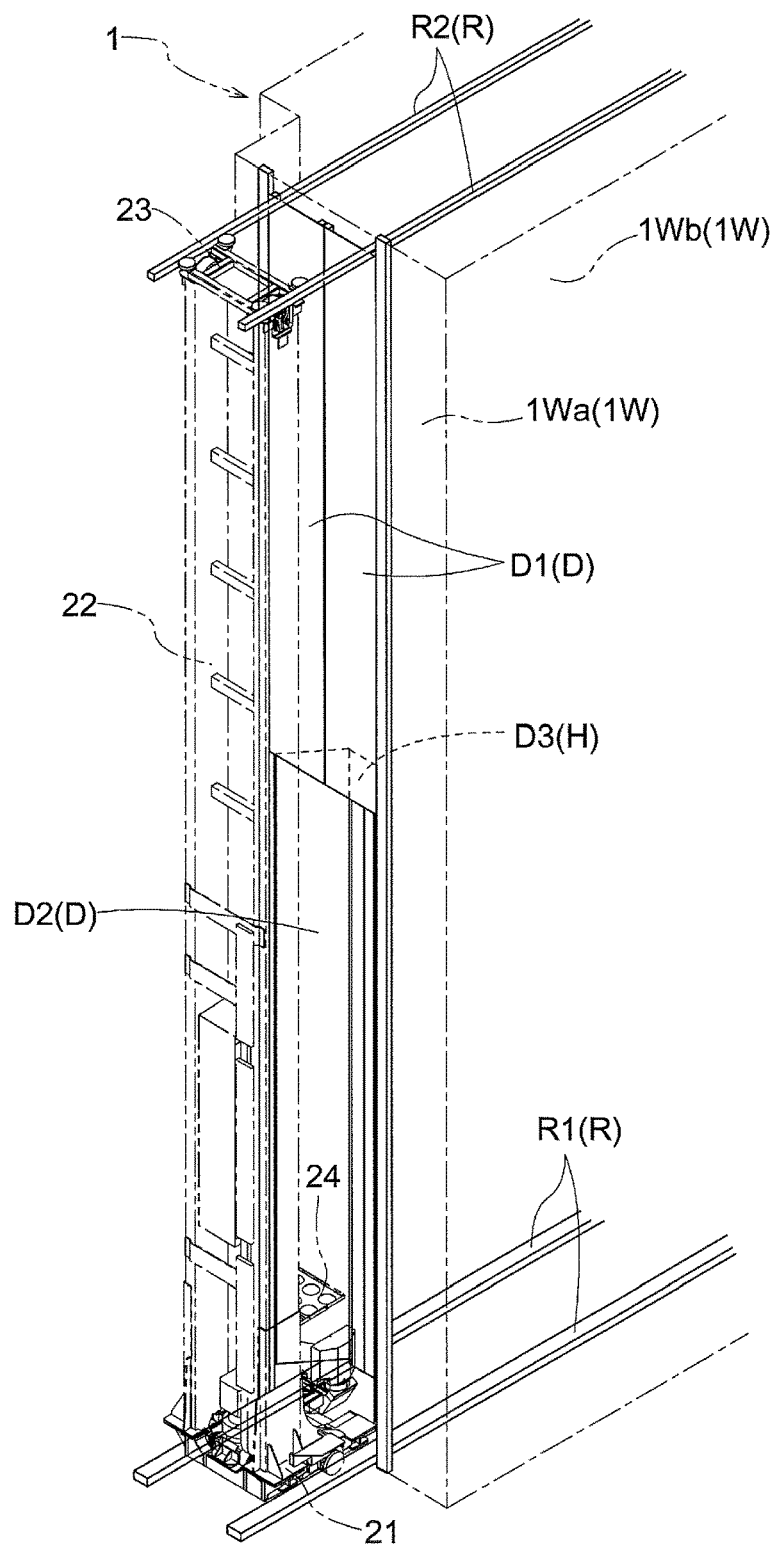
FIG. 9 is a perspective view showing the semiconductor container warehouse in a state in which the lower door is in the intermediate position, the sub-door is in the blocking position, and an upper door is in the closed position.

After the transport movable body 20 is located at the stop position for retrieval, subsequently, as shown in FIG. 9, the upper door D1 is switched to the closed position, and the lower door D2 is switched to the intermediate position.

Here, with respect to the lower door D2, after a pair of left and right lower door leaves D2a and D2b have pivoted to the intermediate position shown in FIG. 6, sub-door leaves D3a and D3b that are pivotably attached to the pair of left and right lower door leaves D2a and D2b, respectively, are caused to pivot to the blocking position (see the long-short dashed arrows).

Figure 8:
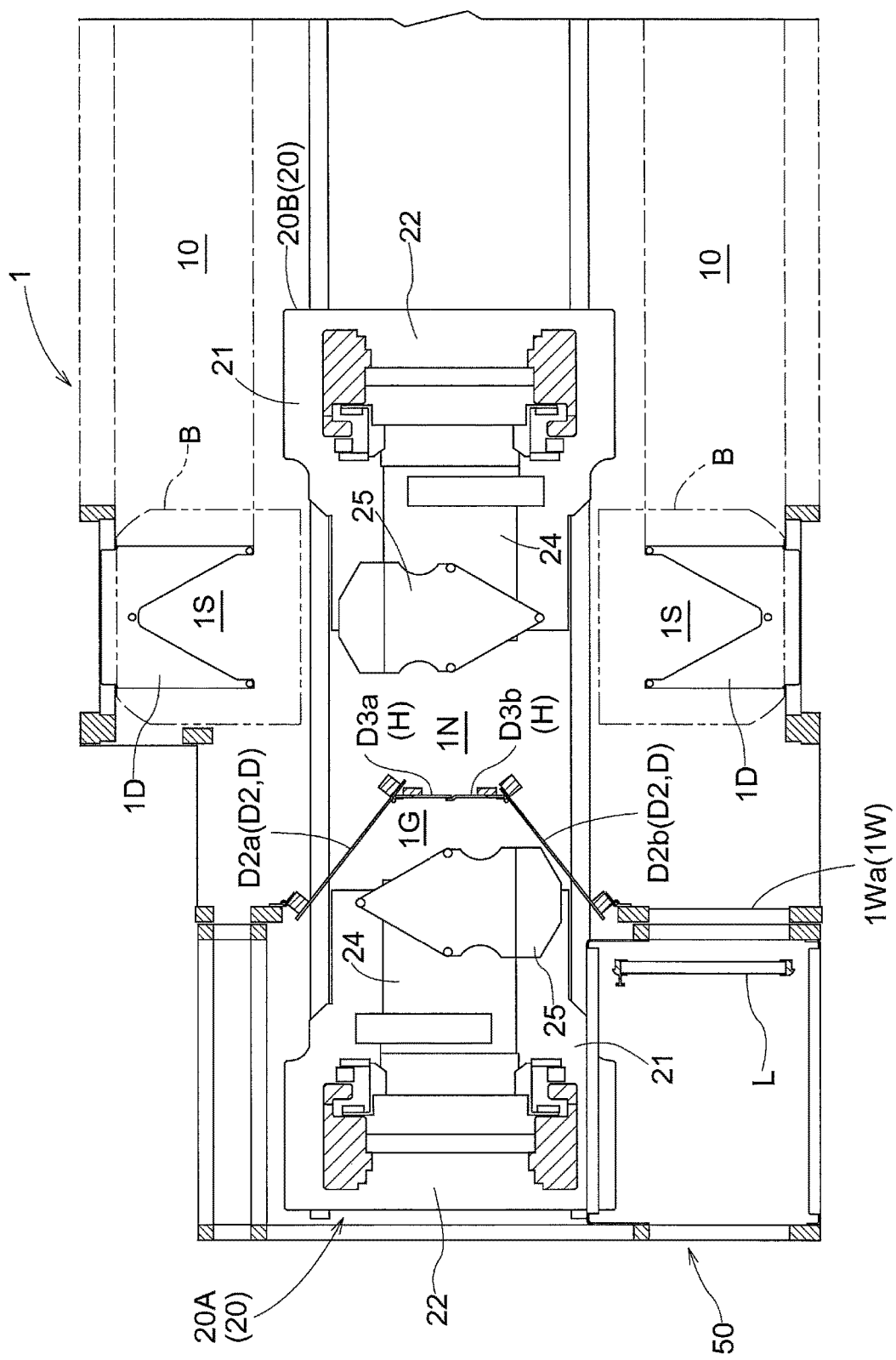
FIG. 8 is a plan view showing the semiconductor container warehouse in a state in which a transport movable body to be subjected to maintenance is located in an external space and the sub-door is in the blocking position.

Consequently, as shown in FIGS. 7 and 8, a blocking state in which the portion through which the internal space 1N and the external space 1G communicate with each other is blocked can be achieved, with the transport movable body 20 being retrieved to the external space. Also, as shown in FIG. 8, a state in which the external space 1G protrudes into the internal space 1N side can be achieved, and thus a portion of the traveling truck 21 on the internal space 1N side and a portion of the elevation body 24 on the internal space 1N side can be located in that protruding portion. That is to say, the traveling truck 21 and the elevation body 24 can be located in the external space 1G in a state in which the traveling truck 21 and the elevation body 24 protrude into the internal space 1N side beyond the path-dividing wall portion 1Wa with respect to the left-right direction, and an overall region that the transport movable body 20 occupies on the outward side of the path-dividing wall portion 1Wa with respect to the left-right direction can thus be reduced. Moreover, the external space 1G and the internal space 1N are separated from each other by switching the sub-door D3 to the blocking position after switching the upper door D1 to the closed position and the lower door D2 to the intermediate position. Thus, as shown in FIG. 8, it is possible to allow the transport movable body 20 (second transport movable body 20B in the example shown in FIG. 8) that is not to be subjected to maintenance to safely travel in the traveling area of the transport movable body 20 (first transport movable body 20A in the example shown in FIG. 8) that is to be subjected to maintenance. Therefore, a decrease in the overall operation efficiency of the facility can be avoided as much as possible.

Other Embodiments (1) In the foregoing embodiment, a transport movable body including a stacker crane in which the elevator masts 22 are provided upright on the traveling truck 21 and the elevation body 24 capable of moving up and down along the elevator masts 22 is provided was described. However, the present invention is not limited to this configuration. The transport movable body can be configured by various movable bodies that travel on the traveling rail and transport articles, including, for example, a self-propelled truck that travels on the traveling rail.

(2) In the foregoing embodiment, a configuration was described in which the axis (shaft) provided on the end portion of the door D on the side opposite to the door pivot axis in plan view is used as the blocking member pivot axis, and the sub-door D3 attached to the door D in such a manner as to be pivotable about the blocking member pivot axis is used as the blocking member H. However, various configurations that can block the portion through which the internal space 1N and the external space 1G communicate with each other can be adopted as the blocking member H, including, for example, a structure in which separate plate-shaped bodies are attached to the left and right doors D.

(3) In the foregoing embodiment, a configuration was described in which the door D is split into two portions, namely, the upper door D1 and the lower door D2. However, the present invention is not limited to this configuration. A configuration in which the door D is split into three or more portions with respect to the vertical direction may also be adopted. Moreover, a configuration may also be adopted in which a single door D or a pair of doors D extending continuously in the vertical direction are provided, and the blocking member is provided on the door D or the pair of doors D.

(4) In the foregoing embodiment, a configuration was described in which a double-leaf door whose left and right door leaves are individually opened and closed is used as the door D. However, instead of this configuration, a configuration may also be adopted in which a pivotable door including on either the left or right end portion thereof a pivot axis extending in the vertical direction is used as the door D, a second pivotable door is provided on the pivoting end portion side of that door, and furthermore a third pivotable door is provided on the pivoting end portion side of the second pivotable door. In this case, for example, the portion through which the internal space 1N and the external space 1G communicate with each other can be blocked by the door, the second pivotable door, and the third pivotable door in a state in which these doors protrude into the internal space side in such a manner as to form a trapezoid or a rectangle in plan view.

Moreover, in the foregoing embodiment, a configuration was described in which the sub-door D3 is switched to the blocking position in a state in which the lower door D2 has been switched to the intermediate position, which is the position between the open position and the closed position. However, the present invention is not limited to this configuration. A configuration may also be adopted in which the sub-door D3 can be switched to the blocking position in a state in which the lower door D2 is in the open position.

(5) In the foregoing embodiment, a configuration is adopted in which two transport movable bodies 20 (transport movable bodies 20A and 20B) travel along the same traveling path. However, a configuration may also be adopted in which one or three or more transport movable bodies 20 are provided, and the number of transport movable bodies 20 can be changed as desired. It should be noted that in the case where three or more transport movable bodies 20 are provided, it is preferable to provide a mechanism for interchanging the positions of the transport movable bodies 20 located on opposite end portions of the traveling path with the position of a transport movable body 20 located between those transport movable bodies 20 or to adopt a configuration in which a door for retrieval of the transport movable bodies 20 is provided on a portion of the traveling path other than the opposite end portions.

(6) In the foregoing embodiment, a configuration was described in which the traveling areas respectively covered by the two transport movable bodies 20, which travel along the same traveling path, are set in a state in which the traveling areas do not overlap each other. However, the present invention is not limited to this configuration. A configuration may also be adopted in which running of the transport movable bodies is performed in a state in which the traveling areas covered by the respective transport movable bodies partially or entirely overlap each other.

(7) In the foregoing embodiment, a configuration is adopted in which two sensors, namely, the first detection sensor S1 of the proximity detection type, which detects whether the door D is in the closed position, and the second detection sensor S2 of the proximity detection type, which detects whether the blocking member is in the blocking state, are provided as the door state detector. However, instead of this configuration, various detection systems that enable detection of whether the door D is in the closed position and whether the blocking member is in the blocking state can be used as the door state detector, including, for example, a detection system in which a camera that images the door D is provided and the controller C determines whether the door D is in the closed position and whether the blocking member is in the blocking state by analyzing an image captured by the camera.

(8) In the foregoing embodiment, a configuration is adopted in which, when the sub-door D3 is switched to the blocking position after the upper door D1 has been switched to the closed position and the lower door D2 to the intermediate position, the gap formed in the portion where the upper door D1 and the lower door D2 are adjacent to each other in the vertical direction is not blocked. However, a configuration with a blocking member for blocking the above-described gap may also be adopted.

Overview of the Embodiments

The following is a description of an overview of the above-described article storage facility.

An article storage facility includes an article storage rack including a plurality of storage sections arranged in a first direction along a horizontal direction and a second direction along a vertical direction, the storage sections each being capable of storing a container in which a semiconductor substrate is accommodated, a transport movable body that is movable along a traveling path in the first direction, the travelling path being provided extending in the first direction in front of the article storage rack, and a wall-shaped member that is provided laterally around an internal space in which the article storage rack and the transport movable body are arranged and that demarcates the internal space from an external space in plan view, wherein the transport movable body includes a transfer device that is capable of transferring the container between the transfer device and each of the storage sections, wherein the traveling path is formed extending continuously from the internal space to the external space in a state in which the travelling path is divided by the wall-shaped member, an opening through which the transport movable body can pass is formed in a path-dividing wall portion that is a portion of the wall-shaped member that divides the traveling path, a door that is pivotable about a door pivot axis extending in the second direction is provided in the opening, the door is configured such that a position thereof is switchable between a closed position in which the door extends along the path-dividing wall portion and blocks the opening and an open position in which the door is located on the internal space side and opens the opening so that the transport movable body can pass through the opening, and a blocking member is provided that is switchable to a blocking state in which the blocking member blocks a portion through which the internal space and the external space communicate with each other in a state in which the position of the door is switched to an intermediate position between the open position and the closed position or to the open position and the transport movable body is stopped at a target position, the target position being a position of the transport movable body at which the opening is within an extent of the transport movable body in the first direction.

That is to say, the transport movable body can be retrieved to the external space by switching the door to the open position, stopping the transport movable body at the target position, then, switching the door to the intermediate position or the open position, and in this state, switching the blocking member to the blocking state.

Thus, the amount of the external space that is occupied by the transport movable body can be reduced when compared with, for example, a configuration in which the transport movable body is retrieved to the external space by switching the door to the closed position in a state in which the entire transport movable body is located on the outward side of the opening with respect to the first direction.

It should be noted that the blocking state as used herein includes not only a state in which the flow of a gas between the internal space and the external space is completely shut off, but also a state in which the flow of a small amount of gas between the internal space and the external space is allowed.

Therefore, it is possible to provide an article storage facility that can minimize the amount of the external space that is occupied by a transport movable body during maintenance.

Here, it is preferable that the blocking member is a sub-door attached to the door in such a manner as to be pivotable about a blocking member pivot axis, the blocking member pivot axis is disposed on an end portion of the door on a side opposite to the door pivot axis in plan view, the sub-door is configured to be switchable between a storage position in which the sub-door extends along the door in plan view and a blocking position in which the sub-door has a larger pivot angle than that in the storage position, the pivot angle being an angle formed by the door and the sub-door around the blocking member pivot axis in plan view, and the blocking member is configured to be switched to the blocking state by switching the position of the door to the intermediate position and switching the position of the sub-door to the blocking position.

That is to say, the portion through which the internal space and the external space communicate with each other can be blocked by switching the sub-door attached to the door to the blocking position. Thus, the operation of switching the blocking member to the blocking state can be facilitated when compared with a configuration in which a blocking member is prepared separately from the door, and the separate blocking member is attached to the door when the blocking state is to be achieved.

Moreover, it is preferable that the door is split into a plurality of split portions in the second direction and is configured such that the plurality of split portions are individually switchable between the open position and the closed position, and the sub-door is provided on at least one split portion of the plurality of split portions.

That is to say, the sub-door is additionally attached to the door, thus making the configuration more complicated when compared with the case where the door is provided alone. According to the present configuration, the sub-door can be provided on a required portion of the plurality of split portions in accordance with the shape of the transport movable body, and thus the overall configuration of the facility can be simplified.

Moreover, it is preferable that the transport movable body includes a traveling truck that is capable of traveling along the traveling path, an elevator mast that is provided upright on the traveling truck, and an elevation body that moves up and down guided by the elevator mast, the elevator mast is provided upright on a portion of the traveling truck that is nearer to a first side of the traveling truck than a central portion of the traveling truck with respect to the first direction, the first side being one side of the traveling truck with respect to the first direction, the elevation body is provided in a state in which the elevation body extends from the elevator mast to a side opposite to the first side, and when the transport movable body is located in the internal space, the transport movable body is provided in an orientation in which the first side faces the door.

That is to say, when the transport movable body is stopped at the target position, the elevator mast is located on the outward side of the opening with respect to the first direction, that is to say, in the external space. Thus, in a region (height range) with respect to the second direction where the traveling truck and the elevation body are not present and only the elevator mast is present, the portion of the opening through which the internal space and the external space communicate with each other can be blocked even by a door provided with no sub-door. Moreover, when the transport movable body is stopped at the target position, the opening may be located within the extent of the traveling truck and the elevation body in the first direction depending on the position of the elevator mast relative to the traveling truck and the amount by which the elevation body protrudes from the elevator mast. Thus, in such a case, if a configuration is adopted in which a door in the height range (region with respect to the second direction) where the traveling truck and the elevation body are present is provided with a sub-door, the portion of the opening through which the internal space and the external space communicate with each other in the height range where the traveling truck and the elevation body are present can be blocked.

Moreover, it is preferable that the article storage facility includes a door state detector that detects whether the door is in the closed position and whether the blocking member is in the blocking state, and a controller that controls a transport operation of the transport movable body, wherein the controller is configured to allow the transport movable body to perform the transport operation on the condition that an operation-permitted state is achieved, the operation-permitted state being one of a state in which the door state detector detects that the door is in the closed position and a state in which the door state detector detects that the blocking member is not in the blocking state.

That is to say, if the door state detector detects that the door is in the open position or the door state detector detects that the blocking member is in the blocking state, there is a possibility that maintenance may be necessary due to a failure of the transport movable body, or the door may be in the open position, allowing the worker to enter the internal space. Thus it is not preferable to continue the transport operation of the transport movable body. According to the present configuration, with regard to the operating conditions of the transport movable body, either the state in which the door state detector detects that the door is in the closed position or the state in which the door state detector detects that the blocking member is not in the blocking state is used as the condition for allowing the transport movable body to perform the transport operation. Therefore, the transport movable body can be allowed to perform the transport operation in an appropriate state in which there is no risk of interfering with the door and the blocking member.

Moreover, it is preferable that the article storage facility includes two of said transport movable bodies, the two transport movable bodies being a first transport movable body and a second transport movable body that individually travel along the traveling path, a first opening provided in a leading end portion of the wall-shaped member with respect to a direction from the second transport movable body toward the first transport movable body along the first direction, the first opening serving as the opening, a first door provided in the first opening, the first door serving as the door, a first blocking member provided corresponding to the first door, the first blocking member serving as the blocking member, a first door state detector that detects whether the first door is in the closed position and whether the first blocking member is in the blocking state, a second opening provided in a leading end portion of the wall-shaped member with respect to a direction from the first transport movable body toward the second transport movable body along the first direction, the second opening serving as the opening, a second door provided in the second opening, the second door serving as the door, a second blocking member provided corresponding to the second door, the second blocking member serving as the blocking member, and a second door state detector that detects whether the second door is in the closed position and whether the second blocking member is in the blocking state, wherein the controller is configured to allow the first transport movable body to perform the transport operation on the condition that a first operation-permitted state is achieved, the first operation-permitted state being one of a state in which the first door state detector detects that the first door is in the closed position and a state in which the first door state detector detects that the first blocking member is not in the blocking state, and to allow the second transport movable body to perform the transport operation on the condition that a second operation-permitted state is achieved, the second operation-permitted state being one of a state in which the second door state detector detects that the second door is in the closed position and a state in which the second door state detector detects that the second blocking member is not in the blocking state.

That is to say, if the first door is not in the closed position or if the first blocking member is in the blocking state, the first transport movable body is not allowed to perform the transport operation. Thus, in a state in which the worker can approach the first transport movable body by switching the first door to the open position, for example, an operation of the first transport movable body unintended by the worker can be avoided, and thus the safety of the worker can be ensured. Moreover, in this case, if the second door is in the closed position or if the second blocking member is not in the blocking state, the second transport movable body is allowed to continue the transport operation, and thus a decrease in operation efficiency of the facility can be suppressed.

Similarly, if the second door is not in the closed position or if the second blocking member is in the blocking state, the second transport movable body is not allowed to perform the transport operation. Thus, in a state in which the worker can approach the second transport movable body by switching the second door to the open position, for example, an operation of the second transport movable body unintended by the worker can be avoided, and thus the safety of the worker can be ensured. Moreover, in this case, if the first door is in the closed position or if the first blocking member is not in the blocking state, the first transport movable body is allowed to continue the transport operation, and thus a decrease in operation efficiency of the facility can be suppressed.

As described above, in the case where two transport movable bodies individually travelling along the traveling path are provided as the transport movable body, it is possible to ensure the safety of the worker while minimizing the decrease in operation efficiency of the facility.

What is claimed is:

1. An article storage facility comprising:
an article storage rack including a plurality of storage sections arranged in a first direction along a horizontal direction and a second direction along a vertical direction, the storage sections each being capable of storing a container in which a semiconductor substrate is accommodated;
a transport movable body that is movable along a traveling path in the first direction, the traveling path being provided extending in the first direction in front of the article storage rack; and
a wall-shaped member that is provided laterally around an internal space in which the article storage rack and the transport movable body are arranged and that demarcates the internal space from an external space in plan view,
wherein the transport movable body includes a transfer device that is capable of transferring the container between the transfer device and each of the storage sections,
wherein the traveling path is formed extending continuously from the internal space to the external space in a state in which the traveling path is divided by the wall-shaped member,
an opening through which the transport movable body can pass is formed in a path-dividing wall portion that is a portion of the wall-shaped member that divides the traveling path,
a door that is pivotable about a door pivot axis extending in the second direction is provided in the opening,
the door is configured such that a position thereof is switchable between a closed position in which the door extends along the path-dividing wall portion and blocks the opening and an open position in which the door is located on the internal space side and opens the opening so that the transport movable body can pass through the opening,
a blocking member is provided that is switchable to a blocking state in which the blocking member blocks a portion through which the internal space and the external space communicate with each other in a specific state in which the position of the door is switched to an intermediate position between the open position and the closed position or to the open position and the transport movable body is stopped at a target position, the target position being a position of the transport movable body at which the opening is within an extent of the transport movable body in the first direction, and
in the specific state, the door and the blocking member switched to the blocking state are disposed at the internal space side with respect to the transport movable body.

2. The article storage facility according to claim 1,
wherein the blocking member is a sub-door attached to the door in such a manner as to be pivotable about a blocking member pivot axis, the blocking member pivot axis is disposed on an end portion of the door on a side opposite to the door pivot axis in plan view, the sub-door is configured to be switchable between a storage position in which the sub-door extends along the door in plan view and a blocking position in which the sub-door has a larger pivot angle than that in the storage position, the pivot angle being an angle formed by the door and the sub-door around the blocking member pivot axis in plan view, and the blocking member is configured to be switched to the blocking state by switching the position of the door to the intermediate position and switching the position of the sub-door to the blocking position.

3. The article storage facility according to claim 2, wherein the door is split into a plurality of split portions in the second direction and is configured such that the plurality of split portions are individually switchable between the open position and the closed position, and the sub-door is provided on at least one split portion of the plurality of split portions.

4. The article storage facility according to claim 3, wherein the transport movable body includes a traveling truck that is capable of traveling along the traveling path, an elevator mast that is provided upright on the traveling truck, and an elevation body that moves up and down guided by the elevator mast, the elevator mast is provided upright on a portion of the traveling truck that is nearer to a first side of the traveling truck than a central portion of the traveling truck with respect to the first direction, the first side being one side of the traveling truck with respect to the first direction, the elevation body is provided in a state in which the elevation body extends from the elevator mast to a side opposite to the first side, and when the transport movable body is located in the internal space, the transport movable body is provided in an orientation in which the first side faces the door.

5. The article storage facility according to claim 1, further comprising:

a door state detector that detects whether the door is in the closed position and whether the blocking member is in the blocking state; and a controller that controls a transport operation of the transport movable body, wherein the controller is configured to allow the transport movable body to perform the transport operation on the condition that an operation-permitted state is achieved, the operation-permitted state being one of a state in which the door state detector detects that the door is in the closed position and a state in which the door state detector detects that the blocking member is not in the blocking state.

6. The article storage facility according to claim 5, further comprising:

two of said transport movable bodies, the two transport movable bodies being a first transport movable body and a second transport movable body that individually travel along the traveling path;

two of said openings, a first opening of the two openings provided in a leading end portion of the wall-shaped member with respect to a direction from the second transport movable body toward the first transport movable body along the first direction;

two of said doors, a first door of the two doors provided in the first opening;

two of said blocking members, a first blocking member of the two blocking members provided corresponding to the first door;

a first door state detector that detects whether the first door is in the closed position and whether the first blocking member is in the blocking state;

a second opening of the two openings provided in a leading end portion of the wall-shaped member with respect to a direction from the first transport movable body toward the second transport movable body along the first direction;

a second door of the two doors provided in the second opening;

a second blocking member of the two blocking members provided corresponding to the second door; and a second door state detector that detects whether the second door is in the closed position and whether the second blocking member is in the blocking state, wherein the controller is configured to allow the first transport movable body to perform the transport operation on the condition that a first operation-permitted state is achieved, the first operation-permitted state being one of a state in which the first door state detector detects that the first door is in the closed position and a state in which the first door state detector detects that the first blocking member is not in the blocking state, and to allow the second transport movable body to perform the transport operation on the condition that a second operation-permitted state is achieved, the second operation-permitted state being one of a state in which the second door state detector detects that the second door is in the closed position and a state in which the second door state detector detects that the second blocking member is not in the blocking state.

7. The article storage facility according to claim 1, further comprising:

two of said doors, the two doors being a left door and a right door; and two of said blocking members, the two blocking members being a left blocking member attached to the left door and a right blocking member attached to the right door, wherein the door pivot axis of the left door and the door pivot axis of the right door are arranged oppositely with respect to the traveling path, and in the specific state, the left blocking member in the blocking state and the right blocking member in the blocking state are arranged so as to block a space between an end portion of the left door on a side opposite to the door pivot axis in plan view and an end portion of the right door on a side opposite to the door pivot axis in plan view.

* * * * *